(12) United States Patent
Lai

(10) Patent No.: US 11,860,671 B2
(45) Date of Patent: Jan. 2, 2024

(54) MEMORY-CONTROL LOGIC AND METHOD OF REDIRECTING MEMORY ADDRESSES

(71) Applicant: Winbond Electronics Corp., Taichung (TW)

(72) Inventor: Chih-Chiang Lai, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 10 days.

(21) Appl. No.: 17/467,848

(22) Filed: Sep. 7, 2021

(65) Prior Publication Data

US 2022/0342827 A1    Oct. 27, 2022

(30) Foreign Application Priority Data

Apr. 26, 2021  (TW) ................................ 110114941

(51) Int. Cl.
*G06F 12/10*     (2016.01)
*G11C 17/16*     (2006.01)
*G11C 17/18*     (2006.01)

(52) U.S. Cl.
CPC .............. *G06F 12/10* (2013.01); *G11C 17/16* (2013.01); *G11C 17/18* (2013.01); *G06F 2212/1032* (2013.01)

(58) Field of Classification Search
CPC ... G11C 17/16; G11C 17/18; G11C 17/00–18; G06F 3/0679; G06F 3/0688; G06F 12/10; H10B 20/00–25
USPC ........... 711/103, 12.001, 170, 202, 200, 203, 711/100, 206, 12.058
See application file for complete search history.

(56) References Cited

U.S. PATENT DOCUMENTS

| | | | |
|---|---|---|---|
| 2002/0199130 A1* | 12/2002 | Kuo ........................ | G11C 29/76 714/6.13 |
| 2008/0010510 A1* | 1/2008 | Turner .................... | G11C 29/76 714/6.13 |
| 2009/0003098 A1* | 1/2009 | Hoess ................... | G11C 29/883 365/200 |
| 2013/0262802 A1* | 10/2013 | Estakhri ................. | G11C 29/82 711/162 |

(Continued)

*Primary Examiner* — Sanjiv Shah
*Assistant Examiner* — Edward Waddy, Jr.
(74) *Attorney, Agent, or Firm* — Birch, Stewart, Kolasch & Birch, LLP

(57) ABSTRACT

A memory-control logic, disposed in a memory circuit, is provided. The memory circuit includes a memory-cell array that is divided into a plurality of regions that include a damaged region. The memory-control logic includes a one-time-programmable (OTP) memory array, an array-control circuit, and an address-redirecting circuit. The array-control circuit programs a memory-size type of the memory-cell array, a region-failure flag corresponding to each region, and a redirecting mapping table corresponding to each region in the OTP memory array. The array-control circuit programs the redirecting mapping table corresponding to each region according to the memory-size type to direct the redirecting mapping table corresponding to each damaged region to non-repetitive good regions. The address-redirecting circuit converts the address signal into a first redirected address signal according to the redirecting mapping table corresponding to each region, and inputs the redirected address signal into the memory-cell array.

14 Claims, 10 Drawing Sheets

(56) References Cited

U.S. PATENT DOCUMENTS

2019/0205244 A1\* 7/2019 Smith .................... G06F 3/065

\* cited by examiner

| region index | $A_n$ | $A_{n-1}$ | $A_{n-2}$ | region-failure flag | $RD_2$ | $RD_1$ | $RD_0$ |
|---|---|---|---|---|---|---|---|
| 0 | 0 | 0 | 0 | 1 | 1 | 0 | 0 |
| 1 | 0 | 0 | 1 | 0 | 0 | 0 | 1 |
| 2 | 0 | 1 | 0 | 0 | 0 | 1 | 0 |
| 3 | 0 | 1 | 1 | 1 | 1 | 0 | 1 |
| 4 | 1 | 0 | 0 | 0 | 1 | 0 | 0 |
| 5 | 1 | 0 | 1 | 0 | 0 | 0 | 1 |
| 6 | 1 | 1 | 0 | 0 | 0 | 1 | 0 |
| 7 | 1 | 1 | 1 | 0 | 1 | 0 | 1 |

FIG. 2A

| region index | $A_n$ | $A_{n-1}$ | $A_{n-2}$ | region-failure flag | $RD_2$ | $RD_1$ | $RD_0$ |
|---|---|---|---|---|---|---|---|
| 0 | 0 | 0 | 0 | 0 | 0 | 0 | 0 |
| 1 | 0 | 0 | 1 | 1 | 1 | 0 | 1 |
| 2 | 0 | 1 | 0 | 1 | 0 | 0 | 0 |
| 3 | 0 | 1 | 1 | 1 | 1 | 0 | 1 |
| 4 | 1 | 0 | 0 | 0 | 0 | 0 | 0 |
| 5 | 1 | 0 | 1 | 1 | 1 | 0 | 1 |
| 6 | 1 | 1 | 0 | 0 | 0 | 0 | 0 |
| 7 | 1 | 1 | 1 | 0 | 1 | 0 | 1 |

FIG. 2B

| region index | $A_n$ | $A_{n-1}$ | $A_{n-2}$ | region-failure flag | $RD_2$ | $RD_1$ | $RD_0$ |
|---|---|---|---|---|---|---|---|
| 0 | 0 | 0 | 0 | 1 | 1 | 1 | 1 |
| 1 | 0 | 0 | 1 | 1 | 1 | 1 | 1 |
| 2 | 0 | 1 | 0 | 1 | 1 | 1 | 1 |
| 3 | 0 | 1 | 1 | 1 | 1 | 1 | 1 |
| 4 | 1 | 0 | 0 | 1 | 1 | 1 | 1 |
| 5 | 1 | 0 | 1 | 1 | 1 | 1 | 1 |
| 6 | 1 | 1 | 0 | 1 | 1 | 1 | 1 |
| 7 | 1 | 1 | 1 | 0 | | | |

| region index | $A_n$ | $A_{n-1}$ | $A_{n-2}$ | region-failure flag | $A_n(L)$ | $A_{n-1}(L)$ | $A_{n-2}(L)$ |
|---|---|---|---|---|---|---|---|
| 0 | 0 | 0 | 0 | 1 | 1 | 0 | 0 |
| 1 | 0 | 0 | 1 | 0 | 0 | 0 | 0 |
| 2 | 0 | 1 | 0 | 0 | 0 | 0 | 0 |
| 3 | 0 | 1 | 1 | 0 | 0 | 0 | 0 |
| 4 | 1 | 0 | 0 | 0->1 | 0 | 0 | 0 |
| 5 | 1 | 0 | 1 | 0 | 0 | 0 | 0 |
| 6 | 1 | 1 | 0 | 0 | 0 | 0 | 0 |
| 7 | 1 | 1 | 1 | 0 | 0 | 0 | 0 |

| region index | $A_n$ | $A_{n-1}$ | $A_{n-2}$ | region-failure flag | $A_n(L)$ | $A_{n-1}(L)$ | $A_{n-2}(L)$ |
|---|---|---|---|---|---|---|---|
| 0 | 0 | 0 | 0 | 1 | 1 | 0 | 0 |
| 1 | 0 | 0 | 1 | 0 | 0 | 0 | 0 |
| 2 | 0 | 1 | 0 | 0 | 0 | 0 | 0 |
| 3 | 0 | 1 | 1 | 1 | 1 | 0 | 1 |
| 4 | 1 | 0 | 0 | 1 | 0 | 0 | 0 |
| 5 | 1 | 0 | 1 | 0->1 | 0 | 0 | 0 |
| 6 | 1 | 1 | 0 | 0 | 0 | 0 | 0 |
| 7 | 1 | 1 | 1 | 0 | 0 | 0 | 0 |

→ newly damaged region

FIG. 5B

MEMORY-CONTROL LOGIC AND METHOD OF REDIRECTING MEMORY ADDRESSES

CROSS REFERENCE TO RELATED APPLICATIONS

This application claims priority of Taiwan Patent Application No. 110114941, filed on Apr. 26, 2021, the entirety of which is incorporated by reference herein

BACKGROUND OF THE INVENTION

Field of the Invention

The present invention relates to memory circuits, and in particular, to a memory-control logic and a method of redirecting memory addresses.

Description of the Related Art

With the continuous development of electronic products and related applications, computer memory can be integrated into system chips coupled with breakthroughs in 2D/2.5D/3D packaging technology, the memory industry can be more flexible in memory design and combinations of memories. In addition, because of the continuous expansion of memory capacity and the continuous shrinking of semiconductor manufacturing process, without using related technologies (e.g., backup components, error correction codes, etc.), it is difficult to achieve further breakthroughs in wafer yield. If only a slight defect makes the entire memory chip unusable, it will cause direct problems such as wasting resources, and indirect problems such as environmental damage, which is not what the industry desires.

BRIEF SUMMARY OF THE INVENTION

Accordingly, a memory-control logic and a method of redirecting memory addresses are provided in the present invention to solve the aforementioned problem.

In an exemplary embodiment, a memory-control logic is provided. The memory-control logic is disposed in a memory circuit. The memory circuit includes a memory-cell array that is divided into a plurality of regions, and the regions include at least one damaged region, and the memory circuit receives an address signal. The memory-control logic includes a one-time-programmable (OTP) memory array, an array-control circuit, and an address-redirecting circuit. The array-control circuit programs a memory-size type of the memory-cell array. The array-control circuit programs a region-failure flag corresponding to each region in the memory-cell array. The array-control circuit programs a redirecting mapping table corresponding to each region in a first array, a second array, and a third array of the OTP memory array. The array-control circuit performs a programming operation on the redirecting mapping table corresponding to each region stored in the OTP memory array according to the memory-size type to direct the redirecting mapping table corresponding to each damaged region to non-repetitive good regions. The address-redirecting circuit converts the address signal into a first redirected address signal according to the redirecting mapping table corresponding to each region stored in the OTP memory array, and inputs the redirected address signal into the memory-cell array.

The first array is a binary array [S1, S0], and when the binary array [S1, S0] is 0b00, 0b01, 0b10, and 0b11, the binary array [S1, S0] corresponds to the memory-size type of 100%, 50%, 25%, and 12.5%, respectively. There is a first number of regions, and when a ratio R of a number of good regions to the first number is between 75% and 100%, 50% and 75%, 25% and 50%, and 12.5% and 50%, the memory-control circuit programs the binary array [S1, S0] of the first array to 0b00, 0b01, 0b10, and 0b11, respectively.

The memory circuit further comprises a row decoder to decode the address signal to obtain a row-address signal, and the address-redirecting circuit converts the row-address signal into the first redirected address signal, that is input into the memory-cell array, according to the redirecting mapping table corresponding to each region stored in the OTP memory array.

When the memory-size type is 50%, the array-control circuit sequentially searches for the damaged region in a first half region of the memory-cell array. When the array-control circuit has found the damaged region in the first half region, the array-control circuit sequentially searches for a good region in a second half region of the memory-cell array. When the array-control circuit has found the good region but has not found the nearest good region, the array-control circuit programs the redirecting mapping table that corresponds to the damaged region to a region index corresponding to the good region, and sets the region-failure flag corresponding to the good region to 1. The array-control circuit further programs the redirecting mapping table corresponding to each region in the second half region to the region index in the corresponding location in the first half region.

When the memory-size type is 25%, the array-control circuit sequentially searches for the damaged region in a first quarter region in the memory-cell array. When the array-control circuit has found the damaged region in the first quarter region, the array-control circuits sequentially searches for a good region in the remaining regions of the memory-cell array. When the array-control circuit has found the good region but has not found the nearest good region, the array-control circuit programs the redirecting mapping table that corresponds to the damaged region to the region index corresponding to the good region, and sets the region-failure flag corresponding to the good region to 1.

When a good region in the memory-cell array becomes a newly damaged region during use of the memory circuit, the array-control circuit searches for another good region in a second half region of the memory-cell array, and programs the redirecting mapping table, that corresponds to the damaged region, to the region index corresponding to the another good region.

The address-redirecting circuit comprises a logic circuit that converts the first redirected address signal into a second redirected address signal according to the memory-size type, and inputs the second redirected address signal into the memory-cell array.

When the binary array [S1, S0] is 0b00, the logic circuit sets the highest bit of the second redirected address signal to the highest bit of the first redirected address signal. When the binary array [S1, S0] is not equal to 0b00, the logic circuit sets the highest bit of the second redirected address signal to 0. When bit S1=1, the logic circuit sets the second highest bit of the second redirected address signal to 0. When bit S1=0, the logic circuit sets the second highest bit of the second redirected address signal to the second highest bit of the first redirected address signal. When the binary array [S1, S0] is 0b11, the logic circuit sets the third highest bit of the second redirected address signal to 0. When the binary array [S1, S0] is not equal to 0b11, the logic circuit sets the third highest bit of the second redirected address signal to the third highest bit of the first redirected address signal.

The memory-cell array further comprises one or more redundant regions, and the memory-control logic utilizes the one or more redundant regions to replace the at least one damaged region.

In another exemplary embodiment, the method of redirecting memory addresses for use in a memory circuit is provided. The memory circuit comprises a memory-control logic and a memory-cell array, and the memory-cell array is divided into a plurality of regions, and the regions comprise at least one damaged region. The memory-control logic comprises a one-time-programmable (OTP) memory array, and the memory circuit receives an address signal. The method includes the following steps: programming a memory-size type of the memory-cell array, a region-failure flag corresponding to each region in the memory-cell array, and a redirecting mapping table corresponding to each region in a first array, a second array, and a third array of the OTP memory array; performing a programming operation on the redirecting mapping table corresponding to each region stored in the OTP memory array according to the memory-size type to direct the redirecting mapping table corresponding to each damaged region to non-repetitive good regions among the regions; and converting the address signal into a first redirected address signal according to the redirecting mapping table corresponding to each region stored in the OTP memory array, and inputting the redirected address signal into the memory-cell array.

BRIEF DESCRIPTION OF THE DRAWINGS

FIGS. 2A-2C are diagrams of the address-remapping operation in accordance with different embodiments of the invention;

FIGS. 5A-5B are diagrams of multiple address-remapping operations in accordance with another embodiment of the invention;

DETAILED DESCRIPTION OF THE INVENTION

Figure 1:
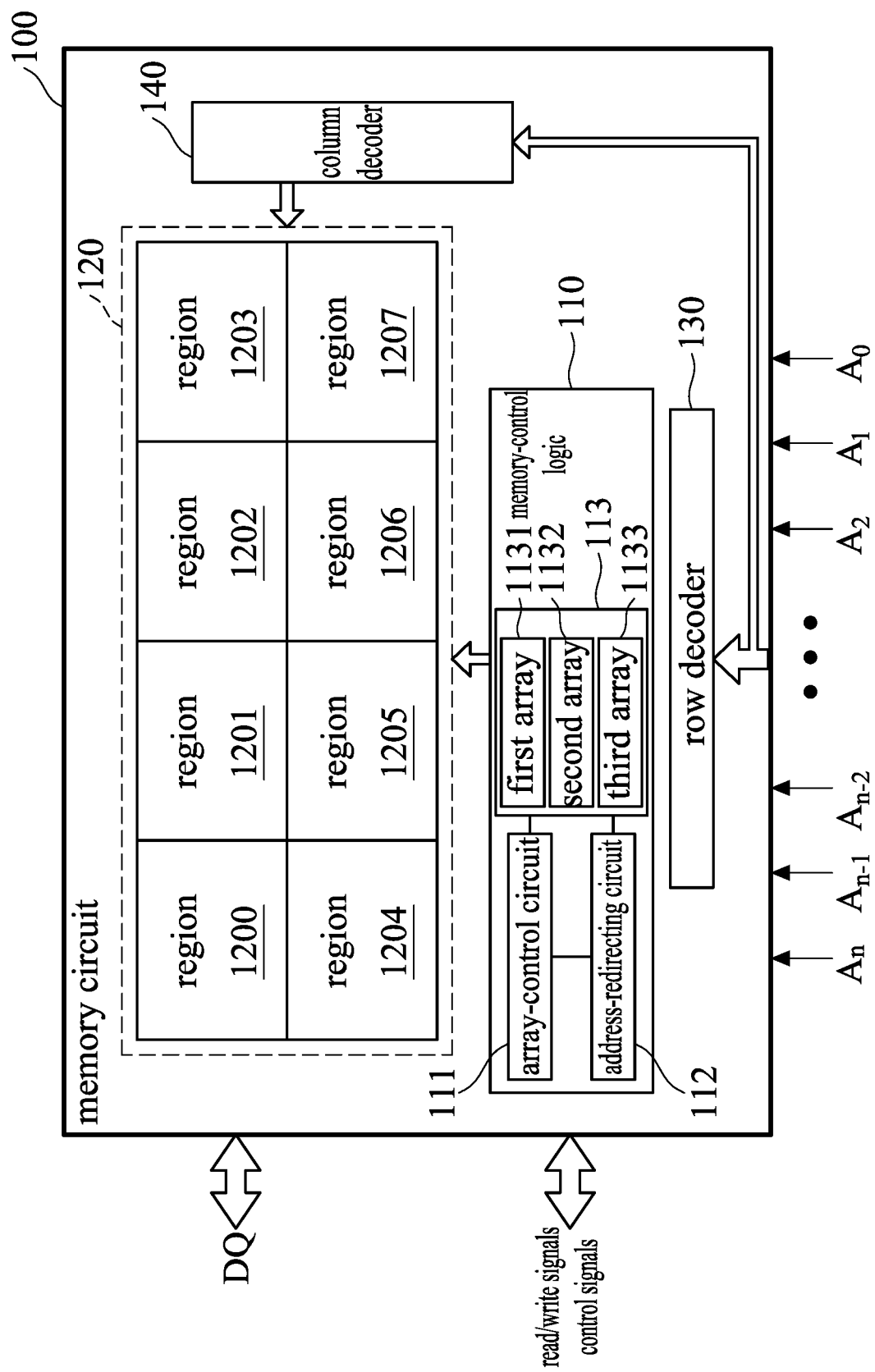
FIG. 1 is a block diagram of a memory circuit in accordance with an embodiment of the invention.

Please refer to FIG. 1. The memory circuit 100 may include a memory-control logic 110, a memory-cell array, a row decoder 130, and a column decoder 140. The memory circuit 100 may receive read and write signals, control signals, data signals DQ, and addresses signals A[n:0], and the memory-control logic 110 may control the memory-cell array 120 according to the read and write signals, and control signals (e.g., including chip-select (CS #) signal, row-address-selection (RAS #) signal, a column-address-selection (CAS #) signal, and write-enable (WE #) signal, etc.). In addition, the memory-control logic 110 may perform refresh operations on the memory-cell array 120.

The total size of the memory space of the memory-cell array 120 is $2^n$ bits. The memory-cell array 120 may be divided into a plurality of regions 1200~1207, wherein each of the regions 1200~1207 has the same memory size. In addition, the memory-cell array 120 may be divided into the regions 1200~1207 according to memory banks, memory blocks, or other dividing methods. The row decoder 130 and the column decoder 140 may perform row decoding and column decoding on the address signal A[n:0] to transmit a row-address signal and a column-address signal to the memory-cell array 120. For example, if the total size of the memory space of the memory-cell array 120 is 4 Gb=$2^{32}$ bits, then n=32.

The memory-control logic 110 may include an array-control circuit 111, an address-redirecting circuit 112, and a one-time-programmable (OTP) memory array 113. The OTP memory array 113 may include a first array 1131, a second array 1132, and a third array 1133. The first array 1131 is configured to record the usable memory size of the memory-cell array 120, wherein the first array 1131 is an array of m bits that can represent $2^m$ types of memory size. The second array 1132 is configured to record a region-failure flag of each region. For example, the region-failure flag of 0 may indicate that the corresponding region is usable (i.e., good region), and the region-failure flag of 1 may indicate that the corresponding region fails (i.e., damaged region). The array-control circuit 111 may configure the second array 1132 according to the test result of each region in the memory-cell array 120, the second array 1132 may be an array of RC (region count) bits, and the region count RC=8. The third array 1133 is configured to record a redirecting mapping table to define the redirected addresses that can be direct to non-repetitive good regions in the memory-cell array 120. The third array 1133 may be an array of RAC*RC bits, where RAC denotes the number of pins for redirecting addresses. In some embodiments, the OTP memory array 113, for example, may be implemented by electrically programmable fuses (eFuse).

The address-redirecting circuit 112 may read the redirecting mapping table corresponding to each region from the third array 1133, and convert the address signal into the redirected address signal that is input to the memory-cell array 120.

If the first array 1131 is a 2-bit array [S1, S0], the combinations of different memory sizes that can be represented by the first array 1131 are shown in Table 1:

TABLE 1

| Region available ratio | S1 | S0 | Available memory-size ratio |
|---|---|---|---|
| 100% | 0 | 0 | 1 |
| >=50% | 0 | 1 | 1/2 |
| >=25% | 1 | 0 | 1/4 |
| >=12.5% | 1 | 1 | 1/8 |

For example, when the array [S1, S0]=0b00 (i.e., a binary value), it indicates that the memory-cell array 120 has no defects, and all regions 1200-1207 in the memory-cell array 120 are in a good condition. Meanwhile, the address signal A[n:0] can be directly input to the memory-cell array 120 without address remapping. When the array [S1, S0]=0b01, it indicates that some regions are invalid and unusable, but the ratio R of the number of good regions to the number of all regions in the memory-cell array 120 is above 50% (i.e., 50%<=R<100%). Meanwhile, the address signal that can be used for addressing become A[n−1:0], so the ratio of the available memory size of the memory-cell array 120 will be come ½ (i.e., 50%).

When the array [S1, S0]=0b10, it indicates that some regions are invalid and unusable, but the ratio R of the number of good regions to the number of all regions in the memory-cell array 120 is above 25% (i.e., 25%<=R<50%). Meanwhile, the address signal that can be used for addressing become A[n−2:0], so the ratio of the available memory size of the memory-cell array 120 will be come ¼ (i.e., 25%). When the array [S1, S0]=0b11, it indicates that some regions are invalid and unusable, but the ratio R of the number of good regions to the number of all regions in the memory-cell array 120 is above 12.5% (i.e., 12.5%<=R<25%). Meanwhile, the address signal that can be used for addressing become A[n−3:0], so the ratio of the available memory size of the memory-cell array 120 will be come ⅛ (i.e., 12.5%).

In addition, it should be noted that if the ratio R is less than ⅛ (i.e., 12.5%), the memory-cell array 120 will be judged as defective during the memory test. If the memory-cell array 120 can be divided into a larger number of regions, the ratio R can be adjusted downward according to practical conditions, such as 1/16 or 1/32.

Assuming that the memory-address space of the regions 1200~1207 in the memory-cell array 120 is continuous, if none of the regions 1200~1207 is damaged, the memory-address spaces of the regions 1200~1207 can be distinguished using the highest 3 bits A[n], A[n−1], and A[n−2] of the address signal A[n:0]. For example, the address signal A[n:n−2]=(0, 0, 0) corresponds to the region 1200 (i.e., region index 0), and the address signal A[n:n−2]=(0, 0, 1) corresponds to the region 1201 (i.e., region index 1), and the address signal A[n:n−2]=(0, 1, 0) corresponds to the region 1202, and so on.

In the first scenario, the memory size of the memory-cell array 120 is reduced to ½, two regions in the memory-cell array 120 are judged as damaged regions by memory-test operations, such as regions 1200 and 1203. Accordingly, the region-failure flags corresponding to the regions 1200 and 1203 (region indexes 0 and 3) will be set to 1, as shown in Table 200 in FIG. 2A. Because the memory-cell array 120 is divided into 8 regions, and two regions are damaged regions, the ratio R of the available memory size of the memory-cell array 120 is ½ (i.e., 50%). At this time, the array-control circuit 111 may program the first array 1131 of the OTP memory array 113 to [S1, S0]=0b01, and program the redirecting mapping tables [$RD_2$, $RD_1$, $RD_0$] corresponding to the indexes 0 and 3 to 0b100 and 0b101, as shown by arrows 201 and 202, respectively.

Specifically, because the ratio of good regions in the memory-cell array 120 is greater than 50%, the redirecting mapping table [$RD_2$, $RD_1$, $RD_0$] can be found in the first half region (e.g., the upper half region) of the memory-cell array 120. The redirecting mapping table [$RD_2$, $RD_1$, $RD_0$] of the first half region can be directly duplicated as the redirecting mapping table [$RD_2$, $RD_1$, $RD_0$] of the second half region (e.g., the bottom half region) of the memory-cell array 120.

Through the aforementioned procedure, the highest bit A[n] of the address signal A[n:0] can be ignored, and the memory size of the memory-cell array 120 can be reduced to ½. When accessing the highest bit A[n], the value of the highest bit A[n] needs not be considered. That is, regardless of A[n]=0 or 1, the memory-control logic 110 can correctly access the data in the memory-cell array 120.

Specifically, in the embodiment of FIG. 2A, the array-control circuit 111 sequentially searches for damaged regions in the first half region (e.g., the upper half region), such as region indexes i=0~3 in the first half region. When the array-control circuit 111 has searched for the damaged regions (i.e., region-failure flag=1) in the first half region, the array-control circuit 111 will sequentially search for the good regions in the second half region (i.e., region indexes i=4~7). When the array-control circuit 111 has found a good region (e.g., region index j) in the second half region but it has not found the nearest good region (e.g., the flag 1st_good_region=0), the array-control circuit 111 may program the redirecting mapping table corresponding to the damaged region to index j, and set the region-failure flag of the good region at region index j to 1, and set the flag 1st_good_region to 1. If the array-control circuit 111 has found a good region (region index j) in the first half region, the array-control circuit 111 may program the redirecting mapping table corresponding to the good region to the region index i. That is, the original region index i of the good region is used as its redirecting mapping table.

Afterwards, for each region index i in the second half region (e.g., the bottom half region) in the memory-cell array 120, the array-control circuit 111 may program the redirecting mapping table for each region index i in the second half region to the redirecting mapping table for the region index (i-RC/2) in the corresponding location in the first half region.

FIG. 2B is a diagram of the address-remapping operation in accordance with another embodiment of the invention.

In the second scenario, the memory size of the memory-cell array 120 is reduced to ¼ (i.e., 25%). In the embodiment, five regions in the memory-cell array 120 are judged as damaged regions by the memory-testing operations, such as regions 1201, 1202, 1203, 1204, and 1206. Accordingly, the region-failure flags corresponding to regions 1201, 1202, 1203, 1204, and 1206 are set to 1, as shown in Table 210 in FIG. 2B. Accordingly, the memory-cell array 120 actually has only three region indexes of good, useable regions.

Because the region 1201 at region index 0 is a good region, the address signal A[n:n−2] corresponding to region index 0 can be used directly. Meanwhile, the array-control circuit 111 may program the first array 1131 in the OTP memory array 113 to [S1, S0]=0b10, and program the redirecting mapping table [$RD_2$, $RD_1$, $RD_0$] corresponding to region index 1 to 0b101, as shown by arrow 211. Accordingly, through the aforementioned procedure, the redirecting mapping tables in the first quarter region (i.e., region indexes 0 and 1) in Table 210 have been built, and the redirecting mapping tables [$RD_2$, $RD_1$, $RD_0$] in the first quarter region can be duplicated as the redirecting mapping tables [$RD_2$, $RD_1$, $RD_0$] in the second quarter region (i.e., region indexes 2 and 3), the third quarter region (i.e., region index 4 and 5), and the fourth quarter region (i.e., region indexes 6 and 7).

Specifically, in FIG. 2B, the array-control circuit 111 may sequentially search for the damaged region in the first quarter region in the memory-cell array 120, such as searching for region indexes i=0 to (RC/4−1) in the first quarter region. When RC=8, the region indexes of the first quarter region include 0 and 1. When the array-control circuit 111 has found the damaged region in the first quarter region (i.e., region-failure flag=1), the array-control circuit 111 may sequentially search for good regions in the remaining regions (e.g., region indexes i=(RC/4) to (RC−1), that is, i=2~7). If the array-control circuit 111 has found a good region (e.g., region index j) in the remaining regions but it has not found the nearest good region (e.g., 1st_good_region=0), the array-control circuit 111 may program the redirecting mapping table corresponding to the damaged region to region index j, set the region-failure flag corresponding to the good region having region index j to 1, and set the flag 1st_good_region to 1. If the array-control circuit 111 has found a good region (e.g., region index i) in the first quarter region, the array-control circuit 111 may program the redirecting mapping table corresponding to the good region to region index I. That is, the original region index i of the good region is used as its redirecting mapping table.

Afterwards, for each region index i in the second quarter region, third quarter region, and fourth quarter region in the memory-cell array 120, the array-control circuit 111 may program the redirecting mapping table for each region index i in the second quarter region, third quarter region, and fourth quarter region to the region index in the corresponding location of the first quarter region. For example, when region index i=RC/4 to RC/2−1 (i.e., corresponding to the second quarter region), the array-control circuit may program the redirecting mapping table corresponding to region index i to region index (i−RC/4), program the redirecting mapping table corresponding to region index (i+RC/4) to region index (i−RC/4), and program the redirecting mapping table corresponding to region index (i+RC/2) to region index (i−RC/4).

In the third scenario, the memory size of the memory-cell array 120 is reduced to ⅛ (i.e., 12.5%). 7 regions in the memory-cell array 120 are judged as damaged regions, such as region 1200~1206. Accordingly, the region-failure flags corresponding to regions 1200~1206 (region indexes 0 to 6) are set to 1, as shown in Table 220 in FIG. 2C. Accordingly, the memory-cell array 120 actually has only the region index of one good region that is useable.

The array-control circuit 111 may program the first array 1131 in the OTP memory array 113 to [S1, S0]=0b11, and program the redirecting mapping table [$RD_2$, $RD_1$, and $RD_0$] corresponding to region index 0 to 0b111, as shown by arrow 221. Accordingly, through the aforementioned procedure, the redirecting mapping table of the first octet region (i.e., region index 0) in Table 220 has been built. The redirecting mapping table [RD2, RD1, RD0] of the first octet region can be duplicated as the redirecting mapping tables [RD2, RD1, and RD0] for the second to eighth octet regions (i.e., region indexes 1 to 7).

Figure 3:
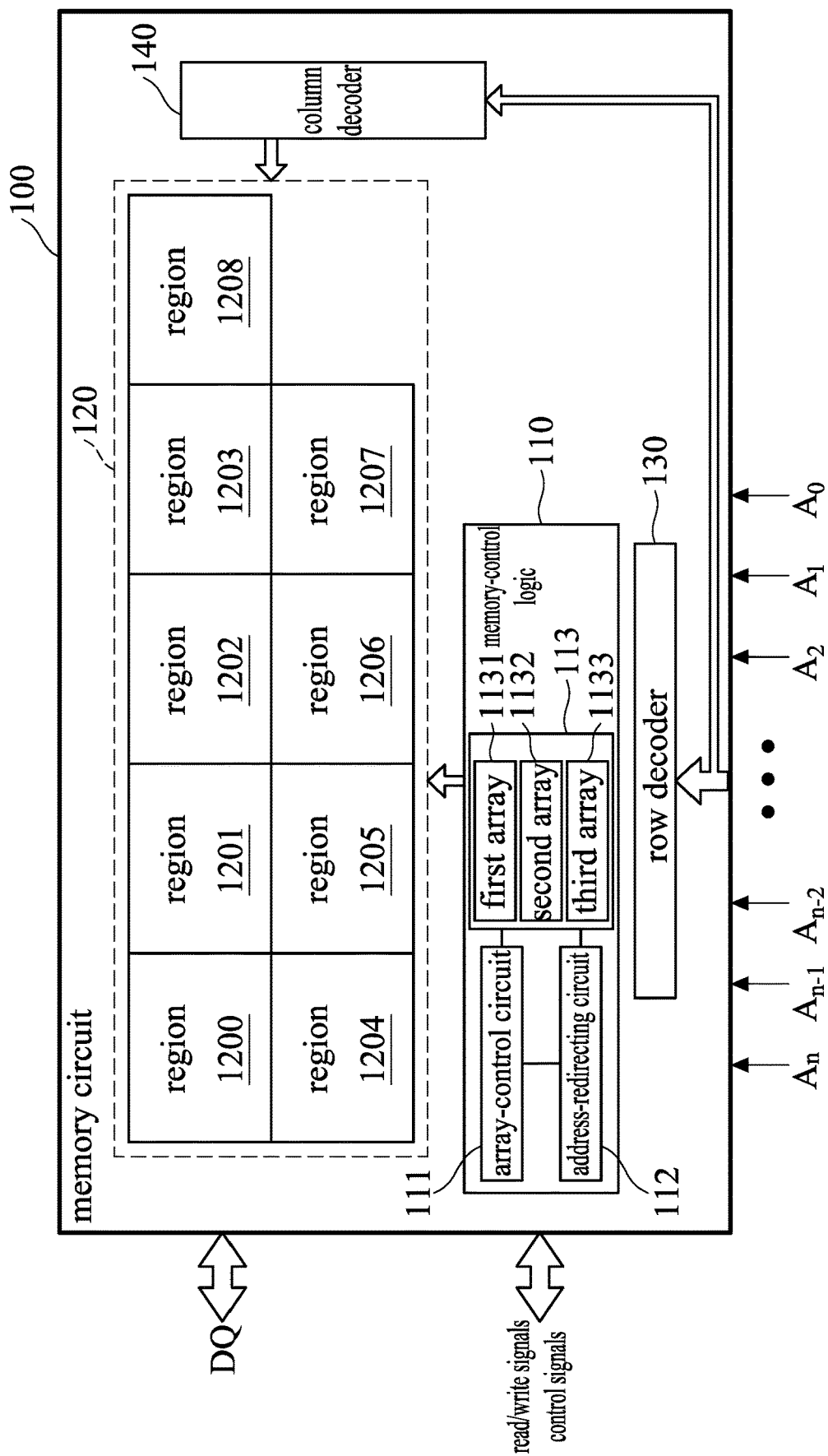
FIGS. 3-4 are block diagrams of the memory circuit in accordance with different embodiments of the invention.

Please refer to both FIG. 1 and FIG. 3. In another embodiment, the total memory size of the memory space of the memory-cell array 120 is $2^n+r$, where r indicates the redundant region. Specifically, the difference between FIG. 3 and FIG. 1 is that the memory-cell array 120 in FIG. 3 further includes a redundant region 1208. It should be noted that the memory-cell array 120 of the present invention is not limited to only include one redundant region, and two or more redundant regions can also be used.

Specifically, when the number of redundant regions in the memory-cell array is greater than or equal to the number of damaged regions, the memory-control logic 110 can use the design of its internal circuit to completely replace the damaged regions with the redundant regions. At this time, the first array 113 is also programmed to be [S1, S0]=0b00, and the available size ratio R of the memory-cell array 120 can still be maintained at 100%. That is, the memory address space can still reach $2^n$.

When the total number of good regions and redundant regions in the memory-cell array 120 is less than the general-region count RC in the memory-cell array 120, but is greater than or equal to half of the general-region count RC, the array-control circuit 111 may program the first array 113 to [S1, S0]=0b01. At this time, the available size ratio of the memory-cell array 120 is reduced to 50%. That is, the memory address space is $2^n/2$. Using a similar method, the available size ratio R of the memory-cell array can be derived using different ratios of the total number of good regions and redundant regions of the memory-cell array 120 to the general-region count RC.

For example, in the final test stage of the memory chip (e.g., memory circuit 100) at the manufacturing end, multiple memory chips can be sorted and classified by grades according to the test-pass number of memory chips, and these memory chips may have different available memory spaces after leaving the factory, or the user of these memory chips can read the value stored in the first array 1131 of the OTP memory array 113 via a memory controller (not shown) to confirm the available memory space of each memory chip. When power to the memory circuit 100 is turned on, in the condition that the first array 1131 is [S1, S0]=0b01, the row decoder 130 will still transmit the row-address signal of the external address signal A[n:0] to the memory-control logic 110, but the address-redirecting circuit 112 of the memory-control logic will remap the row-address signal using the redirecting mapping table in the third array 1133, so that the remapped row address can be directed to a good region.

Figure 4:
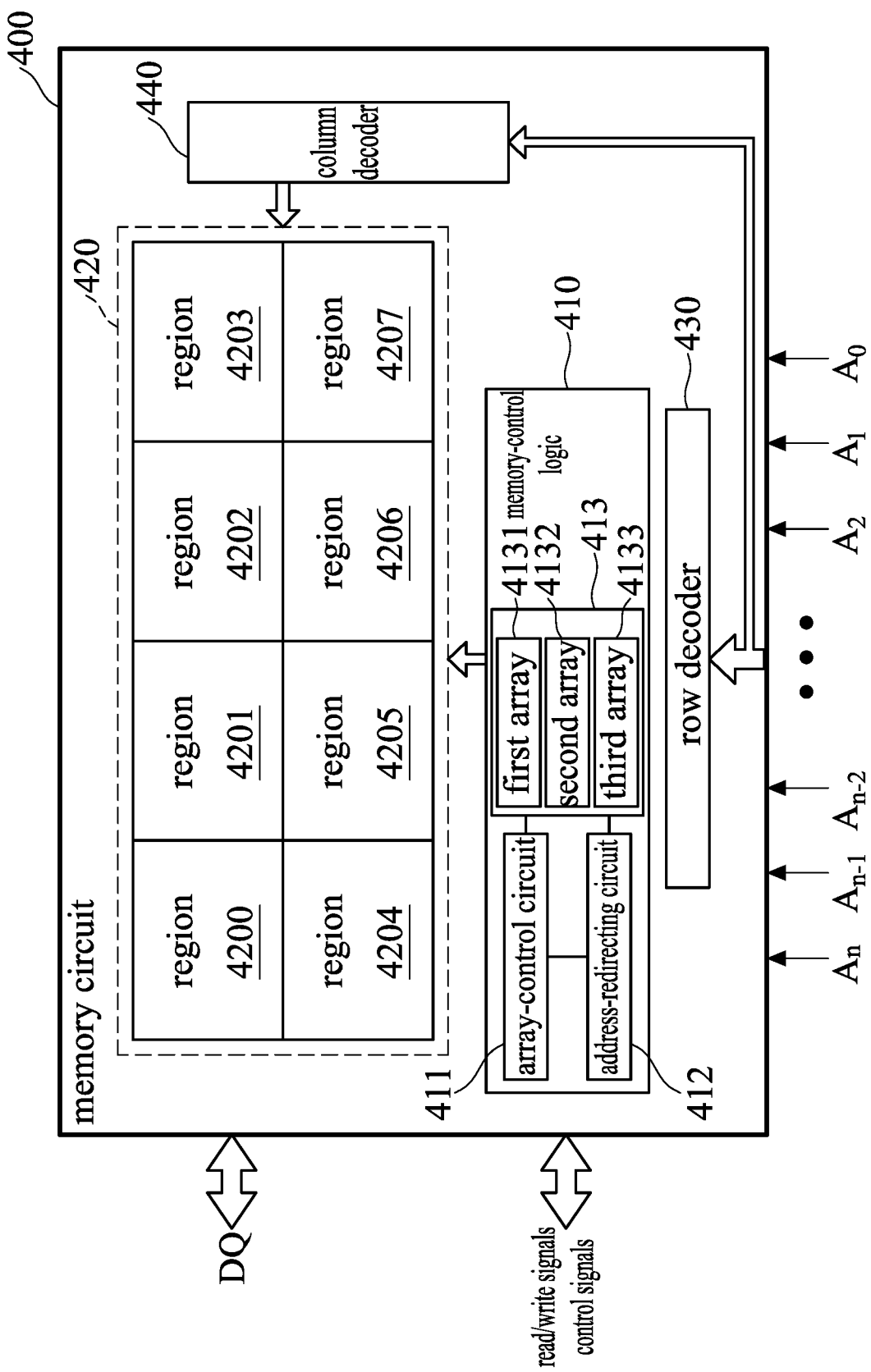
Figure 6:
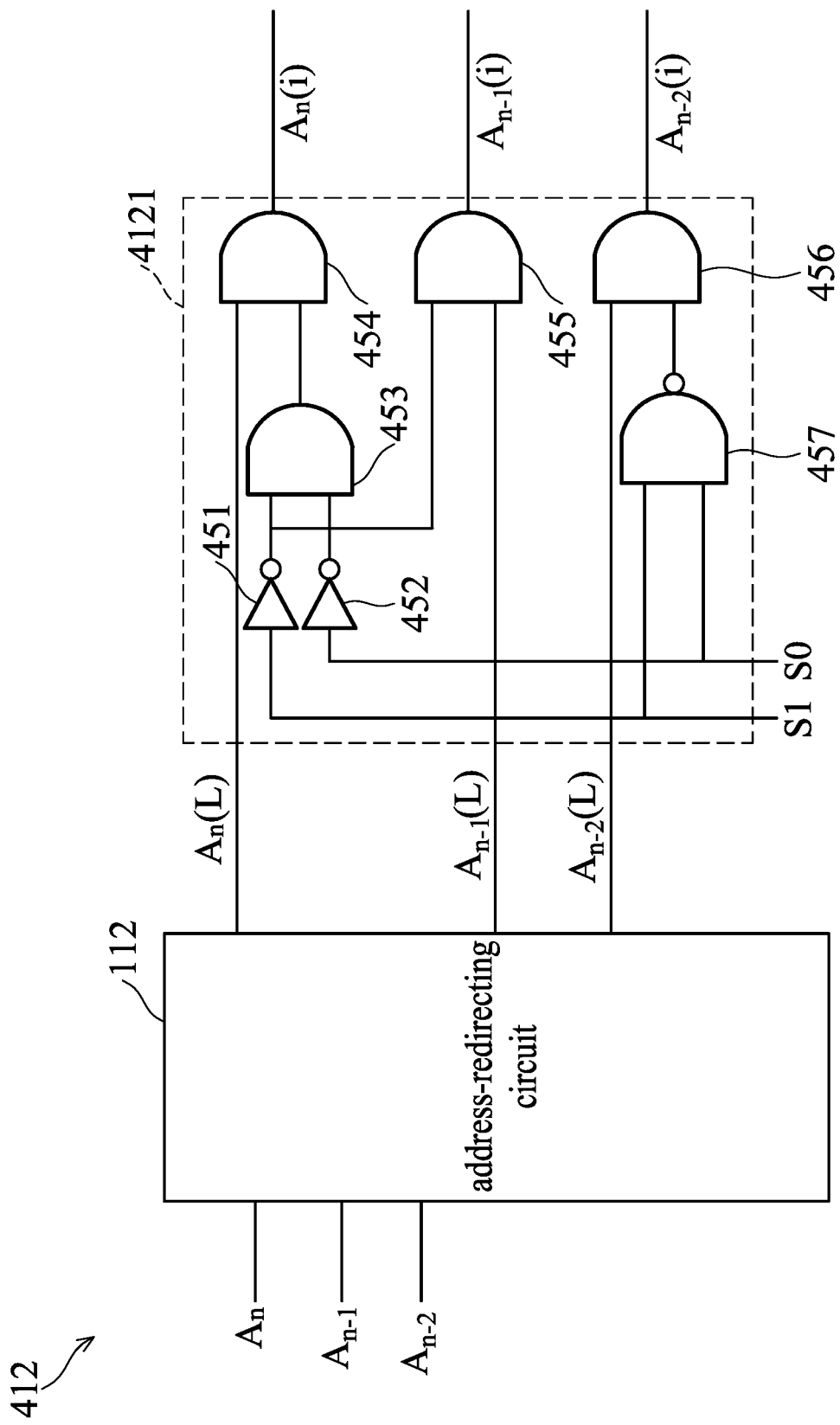
FIG. 6 is a diagram of the address-redirecting circuit in accordance with the embodiment of FIG. 4.

Please refer to FIG. 4, FIGS. 5A-5B, and FIG. 6. The memory circuit 400 in FIG. 4 is similar to the memory circuit 100 in FIG. 1, and the difference is that the array-control circuit 411 in FIG. 4 can perform the programming operation for address redirecting on the damaged regions in the memory-cell array 420 multiple times. In addition, the address-redirecting circuit 412 can be implemented by the address-redirecting circuit 112 in conjunction with a hardware circuit, so as to achieve the automatic-masking function of one or more of the highest bits in the address signal A[n:0], as shown in FIG. 6, and the details will be described later.

For example, Table 500 in FIG. 5A shows that when the memory circuit 100 is shipped from the factory, because region 4200 (i.e., region index 0) in the memory-cell array 420 is a damaged region, the available size of the memory-cell array 420 is reduced to ½. The array-control circuit 411 may search for a good region is the second half region of the memory-cell array 420, and program the redirecting mapping table ($A_n(L)$, $A_{n-1}(L)$, $A_{n-2}(L)$) of region 4200 to 0b100 (i.e., corresponding to region index 4), as shown by arrow 501. In addition, the array-control circuit 411 may program the region-failure flag corresponding to region index 4 to 1 to avoid being used again (i.e., regarded as a damaged region).

When the memory circuit 400 is used for a time period or during use, it is found through a memory test that region 4203 (i.e., corresponding to region index 3) changes from a good region to a newly damaged region. At this time, the array-control circuit 411 may search for another good region in the second half region of the memory-cell array 420, and program the redirecting mapping table ($A_n(L)$, $A_{n-1}(L)$, $A_{n-2}(L)$) corresponding to region 4203 (i.e., corresponding to region index 3) in Table 510 of FIG. 5B to 0b101, as shown by arrow 511. In addition, the array-control circuit 411 may program the region-failure flag corresponding to region index 5 to 1 to avoid being used again (i.e., regarded as a damaged region). Accordingly, when the memory circuit continues to be used and other good regions in the memory-cell array 420 become damaged regions, the array-control circuit 411 can be used to program the redirecting mapping table ($A_n(L)$, $A_{n-1}(L)$, $A_{n-2}(L)$) corresponding to the newly damaged regions to direct to the remaining good regions in the memory-cell array 420.

Please refer to FIG. 6, the address signal $A_n(L)$, $A_{n-1}(L)$, and $A_{n-2}(L)$ (e.g., the first redirected address signal) of the redirecting mapping table corresponding to each region index is not the final row address signal that the address-redirecting circuit transmits to the memory-cell array 420. For example, the address-redirecting circuit 412 may include the address-redirecting circuit 1121 and a logic circuit 4121, and the address signal $A_n(L)$, $A_{n-1}(L)$, and $A_{n-2}(L)$ of the redirecting mapping table output by the address-redirecting circuit 112 will pass through the logic circuit 4121 to generate address signals $A_n(i)$, $A_{n-1}(i)$, and $A_{n-2}(i)$. The address signal An(i), An−1(i), and An−2(i) is the final row address signal that the address-redirecting circuit 412 transmits to the memory-cell array 420.

Specifically, the logic circuit 4121 may include inverters 452 and 452, AND gates 453-456, and a NAND gate 457. The logic circuit 4121 may adjust the generated address signal $A_n(i)$, $A_{n-1}(i)$, and $A_{n-2}(i)$ according to the setting of array [S1, S0] of the first array 4131.

For example, if array [S1, S0]=0b00, the address signal $A_n(i)=A_n(L)$, that is the available memory size of the memory-cell array is 100%, and the all bits in the address signal A[n:0] are valid bits for memory addressing. If array [S1, S0]≠0b00, the address signal $A_n(i)=0$. That is, there are one or more damaged regions in the memory-cell array 420. Thus, the available memory size of the memory-cell array 420 is at most 50%, and the highest bit $A_n$ of the address signal A[n:0] should be set to 0.

If bit S1=1, $A_{n-1}(i)=0$. That is, the number of damaged regions in the memory-cell array 420 exceeds half of the total number of all regions in the memory-cell array 420. Thus, the available memory size of the memory-cell array is at most 25%, and the first highest bit An and the second highest bit An−2 of the address signal A[n:0] should be set to 0. If bit S1≠1 (i.e., S1=0), $A_{n-1}(i)=A_{n-1}(L)$. That is, the available memory size of the memory-cell array 420 is at most 50%, and the second highest bit $A_{n-1}$ of the address signal A[n:0] is a valid bit for memory addressing.

If array [S1, S0]=0b11, the address signal $A_{n-2}(i)=0$. That is, the available memory size of the memory-cell array 420 is 12.5%, and the three highest bits An, An−1, and An−2 of the address signal A[n:0] should be set to 0. If array [S1, S0]≠0b11, the address signal $A_{n-2}(i)=A_{n-2}(L)$, that is the available memory size of the memory-cell array 420 is at least 25%, and thus the third highest bit An−2 of the address signal A[n:0] is a valid bit for memory addressing.

In some special cases, one or more bits of the address signal $A_n(L)$, $A_{n-1}(L)$, and $A_{n-2}(L)$ generated by the address-redirecting circuit 112 may be floating. Through the design of the logic circuit 4121, the address signals $A_n(i)$, $A_{n-1}(i)$, and $A_{n-2}(i)$ output by the address-redirecting circuit 412 can be bound to 0 according to different conditions of array [S1, S0] to avoid causing the control logic 410 to malfunction.

Figure 7A:
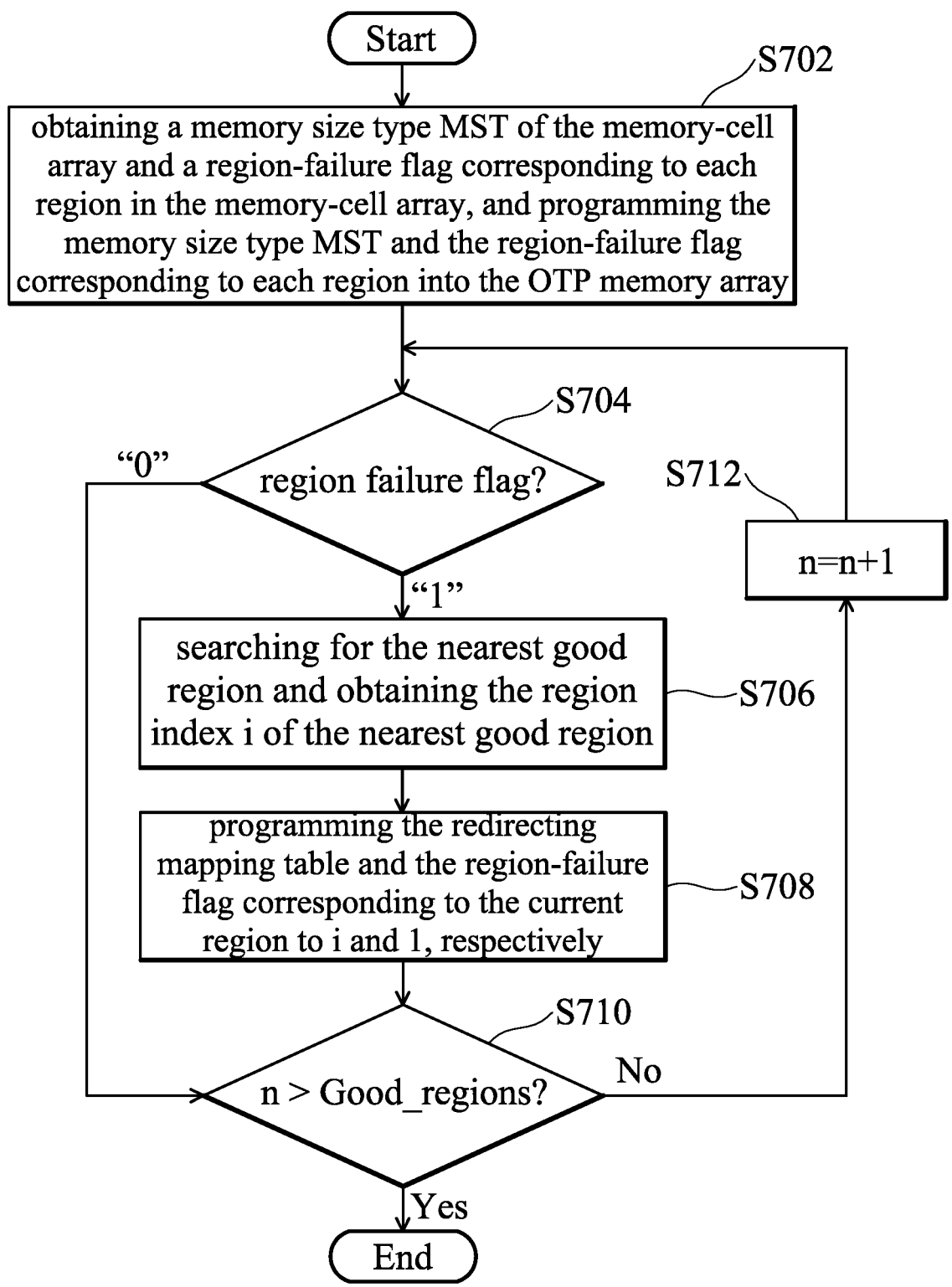
FIG. 7A is a flow chart of a method of redirecting memory addresses in accordance with an embodiment of the invention.

Please refer to FIG. 4 and FIG. 7A. In step S702, the array-control circuit 411 obtains a memory-size type MST of the memory-cell array 420 and a region-failure flag corresponding to each region in the memory-cell array 420, and programs the memory-size type MST and the region-failure flag corresponding to each region into the OTP memory array 413. For example, when the memory-cell array 420 has at least one damaged region, the memory-size type can be 50%, 25%, or 12.5%, and the number of good regions "Good_regions"="the total region count RC"*"the memory-size type MST". In addition, the array-control circuit 411 may set the array index n to 0.

In step S704, the array-control circuit 411 determines the region-failure flag of the current region. If the region-failure flag is 1, steps S706, S708, and S710 are performed.

In step S706, the nearest good region is searched and the region index i of the nearest good region is obtained, where the region index i is represented by a binary value.

In step S708, the redirecting mapping table and the region-failure flag corresponding to the current region are programmed to i and 1, respectively, where i is represented by a binary value.

In step S710, it is determined whether the array index n is greater than the number of good regions "Good_regions". If the array index n is greater than the number of good regions "Good_regions", the flow ends. If the array index is not greater than the number of good regions "Good_regions", step S712 is performed to add 1 to the array index n, and then step S704 is performed.

Figure 7B:
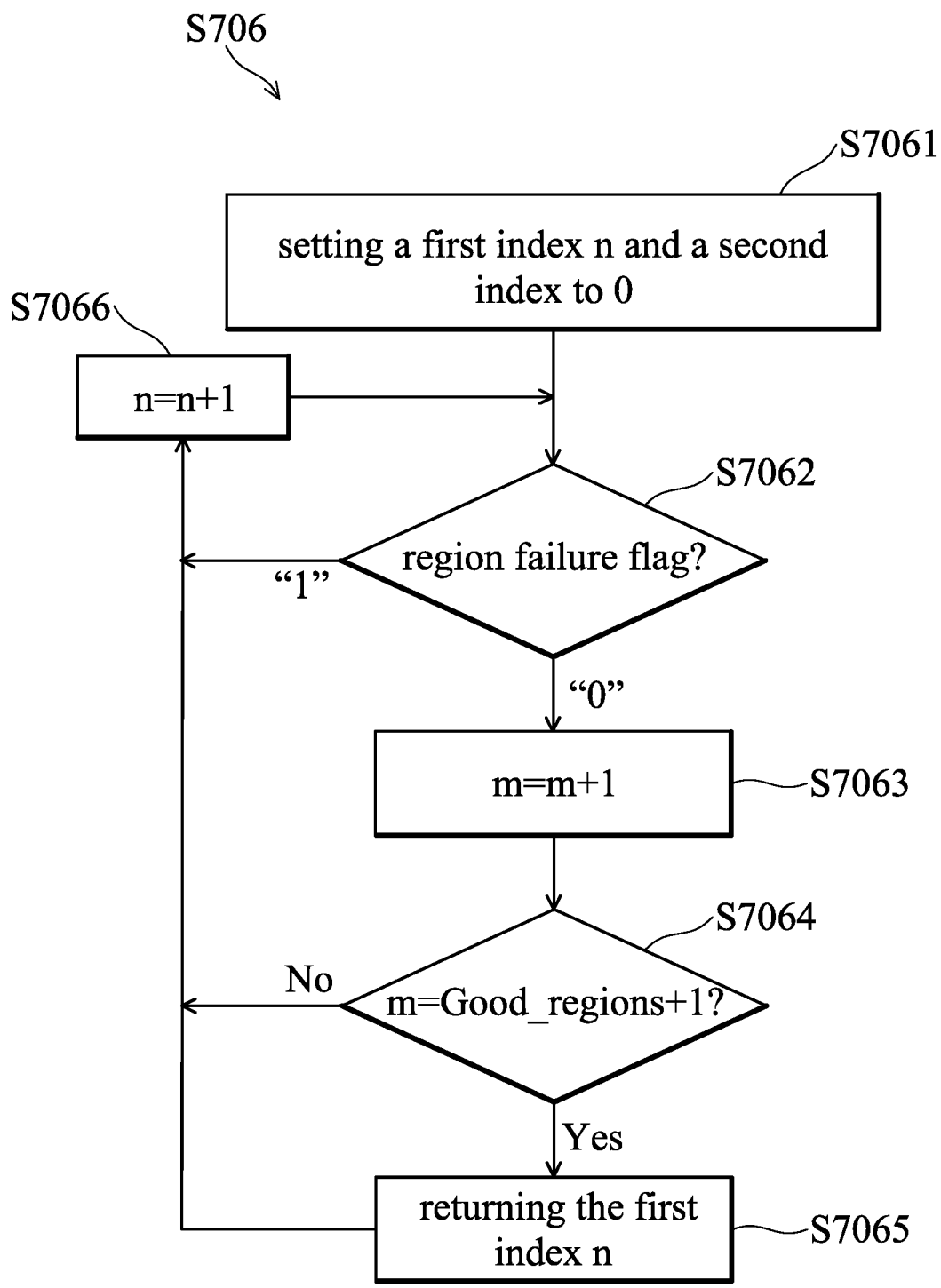
FIG. 7B is a flow chart of step S706 in the 7A embodiment of the present invention.

Please refer to FIG. 4 and FIGS. 7A-7B. Step S706 in FIG. 7A may include steps S7061 to S7066, where step S706 can be regarded as a sub-function to return the region index i of the nearest good region.

In step S7061, a first index n and a second index m are set to 0. It should be noted that the first index n and second index m are for convenience of description, and they are not associated with the array index n in FIG. 7A.

In step S7062, the region-failure flag corresponding to the first index n is determined. If the region-failure flag corresponding to the first index n is 1, step S7066 is performed to increase the first index n by 1. If the region-failure flag corresponding to the first index n is 0, step S7063 is performed to add 1 to the second index m, and then step S7064 is performed.

In step S7064, it is determined whether the second index m is equal to the number of good regions "Good_regions" plus 1. If the second index m is equal to the number of good regions "Good_regions" plus 1, step S7065 is performed to return to the first index n. In other words, in this flow, the number of detected good regions does not reach the preset number of good regions "Good_regions", and thus step S7066 should be performed to add 1 to the first index n, and steps S7062 to S7064 are repeatedly performed.

In view of the above, when the memory-cell array in the memory circuit is damaged (i.e., a defective memory chip), the address signal can be redirected to a good region of the memory-cell array by properly programming the OTP memory array, and thus the memory-control logic and the method of redirecting memory addresses can efficiently utilize the memory size to improve the yield of the memory chip. In addition, the client does not need to use additional circuit board wiring or design when using the memory circuit, so the convenience of use can be improved. For newly damaged regions generated during different use periods of the memory chip, the present invention also provides a highly flexible method of redirecting memory addresses that can program the OTP memory array multiple times to prolong the service life of the memory circuit.

What is claimed is:

1. A memory-control logic, disposed in a memory circuit, wherein the memory circuit comprises a memory-cell array that is divided into a plurality of regions, and the regions comprise at least one damaged region, and the memory circuit receives an address signal, the memory-control logic comprising:
   a one-time-programmable (OTP) memory array;
   an array-control circuit, programming an available memory-size ratio of the memory-cell array, programming a region-failure flag corresponding to each region in the memory-cell array, and programming a redirecting mapping table corresponding to each region into a first array, a second array, and a third array of the OTP memory array;

wherein the array-control circuit performs a programming operation on the redirecting mapping table corresponding to each region stored in the OTP memory array according to the available memory-size ratio to direct the redirecting mapping table corresponding to each damaged region to non-repetitive good regions among the regions; and an address-redirecting circuit, converting the address signal into a first redirected address signal according to the redirecting mapping table corresponding to each region stored in the OTP memory array, converting the first redirected address signal into a second redirected address signal according to the available memory-size ratio, and inputting the second redirected address signal into the memory-cell array, wherein:

the region-failure flag indicates whether the corresponding region is the damaged region, and the address-redirecting circuit masks one or more of the highest bits in the first redirected address signal according to the available memory-size ratio of the memory-cell array, wherein:

the first array is a binary array, when the binary array is a first value, the logic circuit sets a first highest bit of the second redirected address signal to a first highest bit of the first redirected address signal, when the binary array is a second value, the logic circuit sets the first highest bit of the second redirected address signal to 0, when the binary array is the third value, the logic circuit sets the first highest bit and a second highest bit of the second redirected address signal to 0, when the binary array is the fourth value, the logic circuit sets the first highest bit, the second highest bit, and a third highest bit of the second redirected address signal to 0.

2. The memory-control logic as claimed in claim 1, wherein when the binary array is the first value, the second value, the third value, and the fourth value, the available memory-size ratio is 100%, 50%, 25%, and 12.5%, respectively, wherein there is a first number of the regions, and when a ratio of a number of good regions to the first number is between 75% and 100%, 50% and 75%, 25% and 50%, and 12.5% and 50%, the memory-control circuit programs the binary array of the first array to the first value, the second value, the third value, and the fourth value, respectively.

3. The memory-control logic as claimed in claim 2, wherein the memory circuit further comprises a row decoder to decode the address signal to obtain a row-address signal, and the address-redirecting circuit converts the row-address signal into the first redirected address signal, which is input into the memory-cell array, according to the redirecting mapping table corresponding to each region stored in the OTP memory array.

4. The memory-control logic as claimed in claim 2, wherein when the available memory-size ratio is 50%, the array-control circuit sequentially searches for the damaged region in a first half region of the memory-cell array, wherein when the array-control circuit has found the damaged region in the first half region, the array-control circuit sequentially searches for a good region in a second half region of the memory-cell array, wherein when the array-control circuit has found the good region but has not found the nearest good region, the array-control circuit programs the redirecting mapping table that corresponds to the damaged region to a region index corresponding to the good region, and sets the region-failure flag corresponding to the good region to 1, wherein the array-control circuit further programs the redirecting mapping table corresponding to each region in the second half region to the region index in the corresponding location in the first half region.

5. The memory-control logic as claimed in claim 2, wherein when the available memory-size ratio is 25%, the array-control circuit sequentially searches for the damaged region in a first quarter region in the memory-cell array, wherein when the array-control circuit has found the damaged region in the first quarter region, the array-control circuit sequentially searches for a good region in the remaining regions of the memory-cell array, wherein when the array-control circuit has found the good region but has not found the nearest good region, the array-control circuit programs the redirecting mapping table that corresponds to the damaged region to the region index corresponding to the good region, and sets the region-failure flag corresponding to the good region to 1.

6. The memory-control logic as claimed in claim 2, wherein when a good region in the memory-cell array becomes a newly damaged region during use of the memory circuit, the array-control circuit searches for another good region in a second half region of the memory-cell array, and programs the redirecting mapping table that corresponds to the damaged region to the region index corresponding to the another good region.

7. The memory-control logic as claimed in claim 6, wherein the address-redirecting circuit comprises a logic circuit that converts the first redirected address signal into the second redirected address signal according to the available memory-size ratio, and inputs the second redirected address signal into the memory-cell array.

8. The memory-control logic as claimed in claim 7, wherein when the binary array is not equal to the first value, the logic circuit sets the first highest bit of the second redirected address signal to 0, wherein when the binary array is the second value, the logic circuit sets the second highest bit of the second redirected address signal to the second highest bit of the first redirected address signal, wherein when the binary array is not equal to the fourth value, the logic circuit sets the third highest bit of the second redirected address signal to the third highest bit of the first redirected address signal.

9. The memory-control logic as claimed in claim 1, wherein the memory-cell array further comprises one or more redundant regions, and the memory-control logic utilizes the one or more redundant regions to replace the at least one damaged region.

10. The memory-control logic as claimed in claim 9, wherein when the number of redundant regions is greater than or equal to the number of damaged regions, the damaged regions are completely replaced with the redundant regions and the binary array is programmed to be the first value.

11. The memory-control logic as claimed in claim 10, wherein when the total number of good regions and redundant regions is less than the number of regions in the memory-cell array, but is greater than or equal to half of regions in the memory-cell array, the array-control circuit programs the binary array to the second value.

12. The memory-control logic as claimed in claim 1, wherein the logic circuit comprises:
a first inverter coupled to the binary array;
a second inverter coupled to the binary array;
a first AND gate receiving an output of the first inverter and an output of the second inverter;
a second AND gate receiving the output the first inverter and an output of the first AND gate and providing a first output signal;
a third AND gate receiving the output of the first inverter and a second highest bit of the first redirected address signal and providing a second output signal;
a NAND gate coupled to the binary array; and
a fourth AND gate receiving a third highest bit of the first redirected address signal and an output of the NAND gate and providing a third output signal,
wherein the first output signal is provided as the first highest bit of the second redirected address signal, the second output signal is provided as the second highest bit of the second redirected address signal, and the third output signal is provided as the third highest bit of the second redirected address signal.

13. The memory-control logic as claimed in claim 1, wherein the array-control circuit performs the programming operation for address redirecting on the damaged region in the regions multiple times.

14. A method of redirecting memory addresses, for use in a memory circuit, wherein the memory circuit comprises a memory-control logic and a memory-cell array, and the memory-cell array is divided into a plurality of regions, and the regions comprise at least one damaged region, and the memory-control logic comprises a one-time-programmable (OTP) memory array, and the memory circuit receives an address signal, the method comprising:
programming an available memory-size ratio of the memory-cell array, a region-failure flag corresponding to each region in the memory-cell array, and a redirecting mapping table corresponding to each region in a first array, a second array, and a third array of the OTP memory array;
performing a programming operation on the redirecting mapping table corresponding to each region stored in the OTP memory array according to the available memory-size ratio to direct the redirecting mapping table corresponding to each damaged region to non-repetitive good regions among the regions;
converting the address signal into a first redirected address signal according to the redirecting mapping table corresponding to each region stored in the OTP memory array; and
converting the first redirected address signal into a second redirected address signal according to the available memory-size ratio, and inputting the second redirected address signal into the memory-cell array,
wherein:
the region-failure flag indicates whether the corresponding region is the damaged region, and
the address-redirecting circuit masks one or more of the highest bits in the first redirected address signal according to the available memory-size ratio of the memory-cell array,
the first array is a binary array,
in response to determining the binary array is a first value, a first highest bit of the second redirected address signal is set to a first highest bit of the first redirected address signal,
in response to determining the binary array is a second value, the first highest bit of the second redirected address signal is set to 0,
in response to determining the binary array is the third value, the first highest bit and a second highest bit of the second redirected address signal are set to 0.

* * * * *